United States Patent
Lin

(10) Patent No.: US 9,679,188 B2
(45) Date of Patent: Jun. 13, 2017

(54) FINGERPRINT SENSOR PACKAGING MODULE AND MANUFACTURING METHOD THEREOF

(71) Applicant: J-METRICS TECHNOLOGY Co., Ltd., Taipei (TW)

(72) Inventor: Wei-Ting Lin, Taipei (TW)

(73) Assignee: J-METRICS TECHNOLOGY CO., LTD., Taipei (TW)

( * ) Notice: Subject to any disclaimer, the term of this patent is extended or adjusted under 35 U.S.C. 154(b) by 0 days.

(21) Appl. No.: 14/991,550

(22) Filed: Jan. 8, 2016

(65) Prior Publication Data

US 2017/0091517 A1    Mar. 30, 2017

(30) Foreign Application Priority Data

Sep. 25, 2015   (TW) .............................. 104131962 A

(51) Int. Cl.
*G06K 9/00* (2006.01)
*H05K 3/32* (2006.01)
*H05K 1/18* (2006.01)

(52) U.S. Cl.
CPC ......... *G06K 9/00053* (2013.01); *H05K 1/181* (2013.01); *H05K 3/32* (2013.01); *H05K 2201/10151* (2013.01); *H05K 2203/1305* (2013.01)

(58) Field of Classification Search
CPC ...... G06K 9/00053; H05K 1/181; H05K 3/32; H05K 2201/10151; H05K 2203/1305
See application file for complete search history.

(56) References Cited

U.S. PATENT DOCUMENTS

| | | | | |
|---|---|---|---|---|
| 6,694,269 B2* | 2/2004 | Hayes | ................. | G06K 9/0002 382/108 |
| 8,050,467 B2* | 11/2011 | Yang | ................. | G06K 9/00026 382/124 |
| 9,295,158 B2* | 3/2016 | Lin | ...................... | H05K 3/4697 |
| 2002/0096731 A1 | 7/2002 | Wu et al. | | |
| 2008/0096326 A1* | 4/2008 | Reed | ................. | B29C 45/14647 438/126 |
| 2010/0117224 A1* | 5/2010 | McElrea | ................. | H01L 24/82 257/723 |
| 2013/0307818 A1 | 11/2013 | Pope et al. | | |

(Continued)

FOREIGN PATENT DOCUMENTS

TW   201533859   9/2015
TW   M516228    1/2016

*Primary Examiner* — Gregory M Desire
(74) *Attorney, Agent, or Firm* — Andew M. Calderon; Roberts Mlotkowski Safran Cole & Calderon, P.C.

(57) ABSTRACT

A fingerprint sensor packaging module includes a light-pervious cover layer, a conductive pattern layer on the light-pervious cover layer, a finger sensing chip on the conductive pattern layer, a circuit board on the light-pervious cover layer, and a package member. The conductive pattern layer includes a plurality of pads. The fingerprint sensing chip is electrically connected to the conductive pattern layer by contacting to the pads. The circuit board is electrically connected to the conductive pattern layer and has a hole and the hole exposes the fingerprint sensing chip. The fingerprint sensing chip is disposed in the hole. The package member disposed in the hole and at least cover the fingerprint sensing chip.

12 Claims, 7 Drawing Sheets

(56) References Cited

U.S. PATENT DOCUMENTS

| | | | |
|---|---|---|---|
| 2015/0070324 A1* | 3/2015 | Han | G06F 1/1626 345/175 |
| 2015/0146944 A1* | 5/2015 | Pi | H04L 63/0861 382/124 |
| 2016/0049526 A1* | 2/2016 | Oganesian | H01L 31/02002 257/434 |
| 2016/0275333 A1* | 9/2016 | Lin | G06K 9/00053 |

* cited by examiner

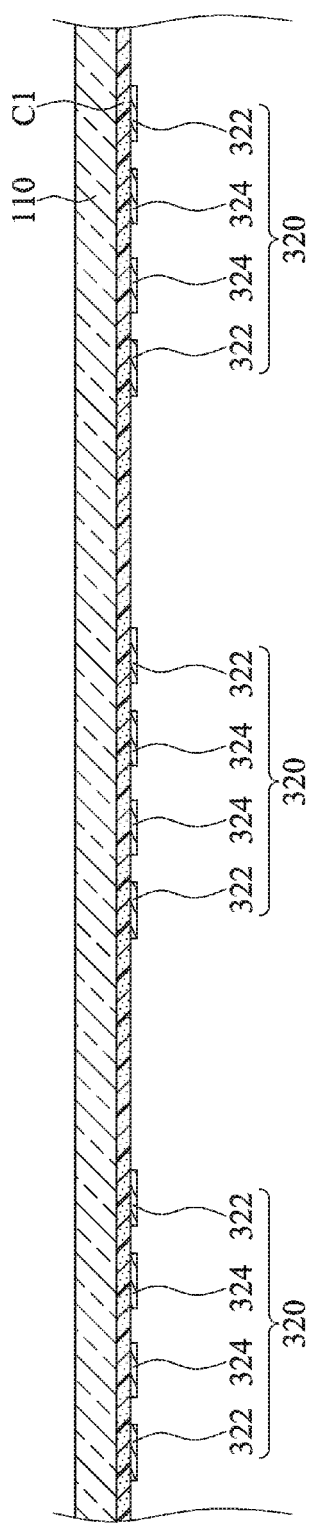
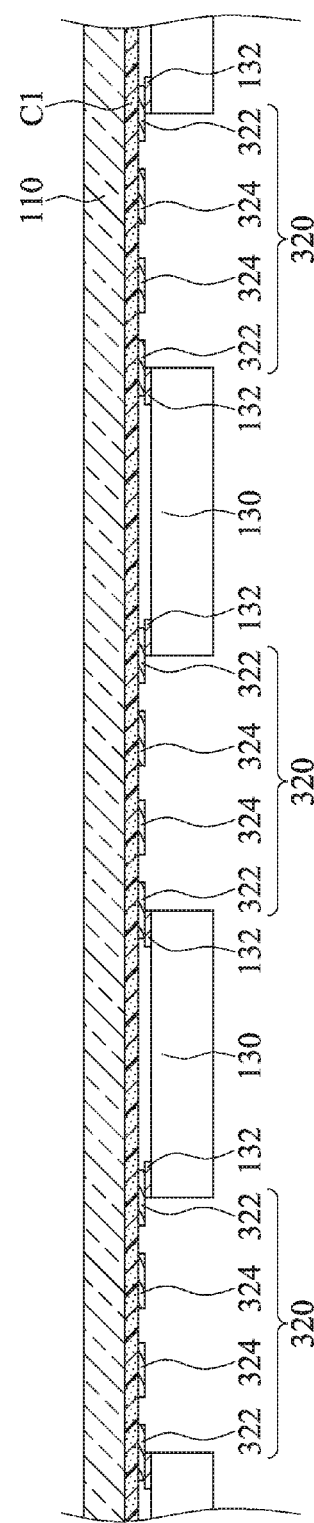

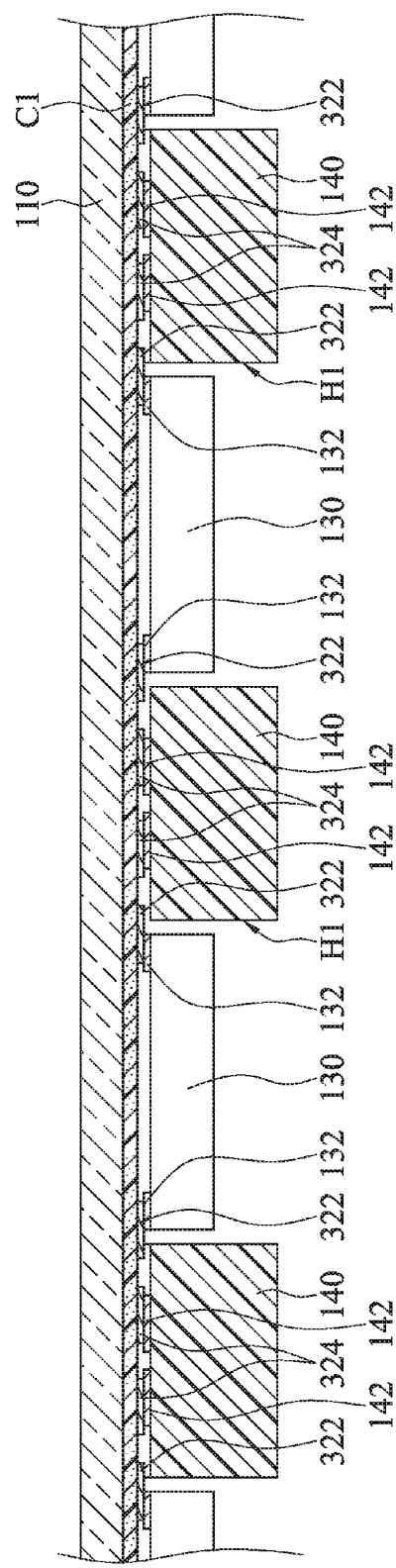
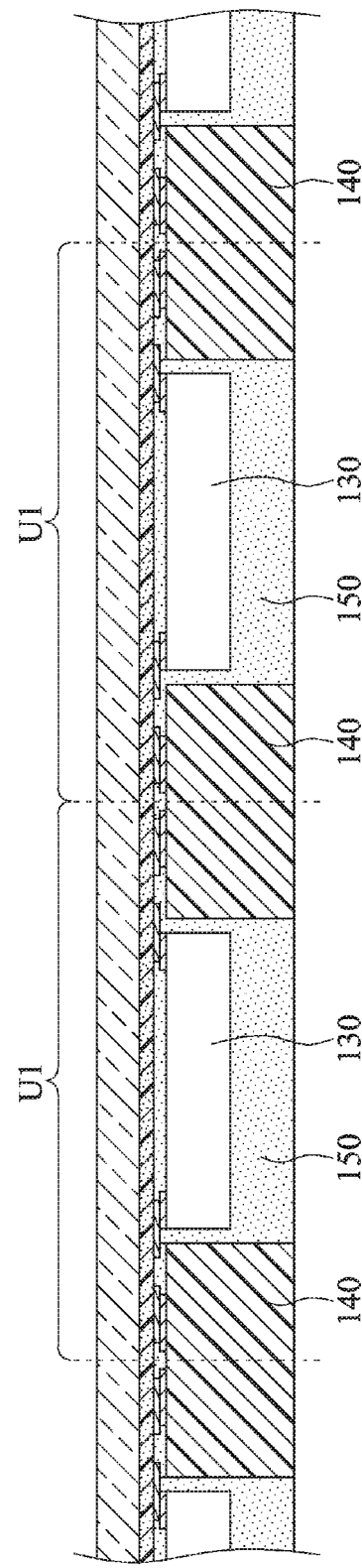
FIG.5C
FIG.5D

FINGERPRINT SENSOR PACKAGING MODULE AND MANUFACTURING METHOD THEREOF

CROSS-REFERENCES TO RELATED APPLICATIONS

This non-provisional application claims priority under 35 U.S.C. §119(a) on Patent Application No. 104131962 filed in Taiwan, R.O.C. on Sep. 25, 2015 the entire contents of which are hereby incorporated by reference.

BACKGROUND

Technical Field

The instant disclosure relates to a fingerprint sensor packaging module, in particular, relates to a fingerprint sensor packaging module having a light-pervious cover layer.

Related Art

As the development of technology, mobile phones, personal notebooks, tablet PCs, or other electronic devices have become the essential apparatus in life. The information stored in those electronic devices, such as contact information and photos, increases rapidly. Those electronic devices are thus become personalized. Therefore, in order to avoid important information from being lost or stolen, the electronic devices respectively equipped with fingerprint identification components become popular.

Existing manufacturing process for producing an electronic device with fingerprint recognition function includes forming an opening on one side of the electronic device, disposing a fingerprint sensing chip in the opening, disposing the corresponding layout circuit, and then covering the fingerprint sensing chip with molding material. Thus, in the existing manufacturing process for producing the electronic devices with fingerprint recognition function, several complicated fabrication steps for additionally mounting the fingerprint sensing chip on the electronic devices are required.

SUMMARY

In an embodiment of the present disclosure, a fingerprint sensor packaging module comprises a light-pervious cover layer, a conductive pattern layer on the light-pervious cover layer, a finger sensing chip on the conductive pattern layer, a circuit board on the light-pervious cover layer, and a package member. The conductive pattern layer comprises a plurality of pads. The fingerprint sensing chip is electrically connected to the conductive pattern layer by contacting to the pads. The circuit board is electrically connected to the conductive pattern layer and has a hole and the hole exposes the fingerprint sensing chip. The fingerprint sensing chip is disposed in the hole. The package member disposed in the hole and at least cover the fingerprint sensing chip.

In an embodiment of the present disclosure, a method of manufacturing a fingerprint sensor packaging module comprises: forming a conductive pattern layer on a light-pervious cover layer, where the conductive pattern layer comprises a plurality of pads; disposing at least one fingerprint sensing chip on the conductive pattern layer, where the fingerprint sensing chip is electrically connected to the conductive pattern layer by contacting to the pads; disposing a circuit board on the light-pervious cover layer, where the circuit board is electrically connected to the conductive pattern layer and has a hole, and the fingerprint sensing chip is disposed in the hole; and disposing a package member in the hole, where the package member at least covers the fingerprint sensing chip.

In summary, in the above mentioned embodiment, the fingerprint sensor packaging module of the present disclosure comprises the light-pervious cover layer, the conductive pattern layer, the fingerprint sensing chip, the circuit board, and the packaging member. The fingerprint sensing chip is disposed on the light-pervious cover layer formed with the conductive pattern layer. The circuit board having the hole is disposed on the light-pervious cover layer formed with the conductive pattern layer, and the hole exposes the fingerprint sensing chip. The packaging member is accommodated in the hole for at least covering a part of the fingerprint sensing chip. When the finger or other objects forces on the light-pervious cover layer, the circuit board can afford a part of force, so as to increase the integral strength of e fingerprint sensor packaging module. Beside, the static electricity from the finger or other objects can be leaded out from the fingerprint sensing chip to the circuit board so that the circuit board can provide fingerprint sensor packaging module with the protection from electrostatic discharge.

In addition, the fingerprint sensor packaging module according to one embodiment of the present disclosure comprises the outer conductive ring which surrounds the circuit board and the light-pervious cover layer. The fingerprint sensor packaging module according to another embodiment of the present disclosure comprises the inner conductive ring which surrounds the fingerprint sensing chip, and the inner conductive ring can be electrically connected to the fingerprint sensing chip through the pads of the conductive pattern layer or other layout pattern. Thus, the design flexibility of the fingerprint sensor packaging module can be improved.

The method of manufacturing a fingerprint sensor packaging module according to one embodiment of the present disclosure can manufacture the individual and modularized packaging module that is capable of easily mounting on the electronic devices, such as the smart phone, notebook and the like.

In addition, in the method of manufacturing a fingerprint sensor packaging module according to one embodiment of the present disclosure, the light-pervious cover layer, can be used as the light-pervious substrate of the electronic devices such as the screen substrate of the smart phone, notebook and the like. Thus, in the above mentioned method of the present disclosure, the fingerprint sensing chip is capable of directly mounting on the screen substrate of the electronic devices. The signal of the fingerprint sensing chip can be transmitted out through the circuit board, so that the complicated layout circuit for mounting the fingerprint sensing chip on the screen substrate of the electronic devices can be simplified and avoided.

BRIEF DESCRIPTION OF THE DRAWINGS

FIGS. 5A-5D are schematic diagrams each illustrating steps of a method of manufacturing a fingerprint sensor packaging module according to the second embodiment of the present disclosure.

DETAILED DESCRIPTION

Figure 1A:
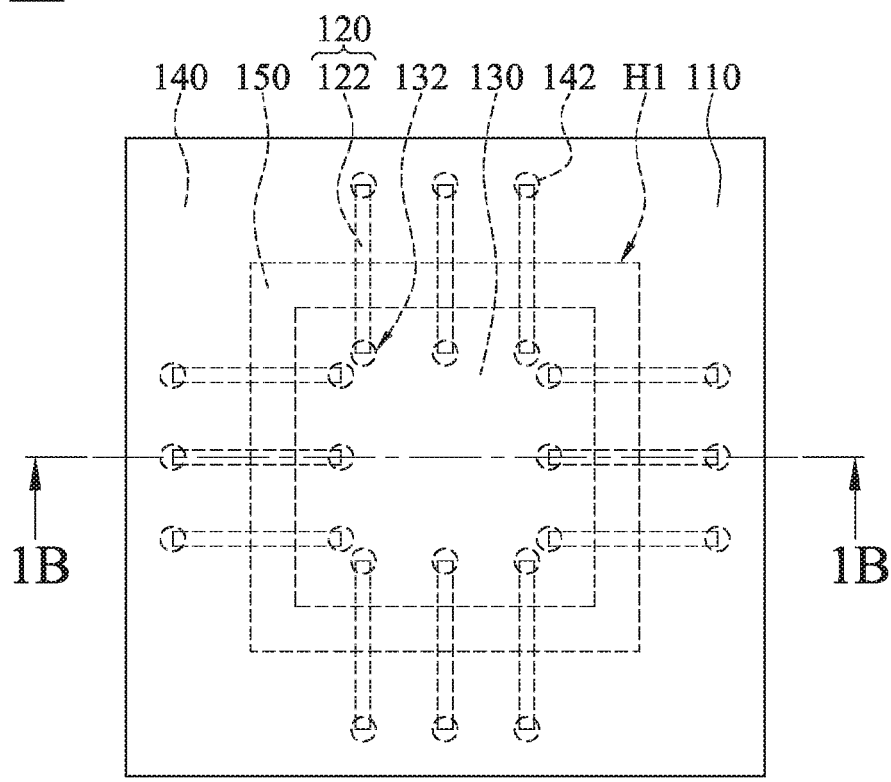
FIG. 1A is a vertical view of a part of fingerprint sensor packaging module according to the first embodiment of the present disclosure.
Figure 1B:
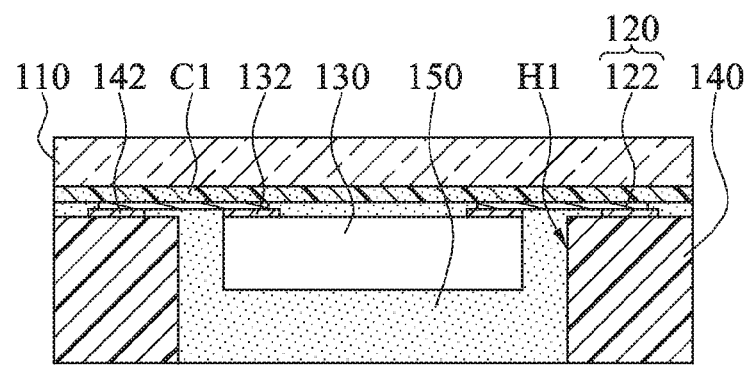
FIG. 1B is a cross-sectional view of a fingerprint sensor packaging module along line 1B-1B of FIG. 1A.

FIG. 1A is a vertical view of a part of fingerprint sensor packaging module according to the first embodiment of the present disclosure. FIG. 1B is a cross-sectional view of a fingerprint sensor packaging module along line 1B-1B of FIG. 1A. Please refer to FIGS. 1A and 1B, the fingerprint sensor packaging module 100 comprises a light-pervious cover layer 110, a conductive pattern layer 120 on the light-pervious cover layer 110, a finger sensing chip 130, a circuit board 140 on the light-pervious cover layer 110, and a package member 150. The fingerprint sensing chip 130 is electrically connected to the conductive pattern layer 120. The circuit board 140 has a hole H1 and the hole H1 exposes the fingerprint sensing chip 130. The package member 150 is disposed in the hole and at least covers the fingerprint sensing chip 130.

The light-pervious cover layer 110 is used as the carrier of the fingerprint sensing chip 130. In practice, the light-pervious cover layer 110 may be glass substrate, plastic substrate or sapphire substrate. Specifically, the light-pervious cover layer 140 is a substrate being pervious to light, and the transmittance of the light-pervious cover layer 110 depends on the light transmitting property of the light-pervious cover layer 140 so that the light-pervious cover layer 140 can be transparent or translucent. The light-pervious cover layer 110 may be capable of allowing a specific light spectrum passing therethrough, for example, visible light. The light-pervious cover layer 110 may be used as a light-pervious cover glass of an electronic device, such as a cover lens of a smart phone.

The conductive pattern layer 120 comprises a plurality of pads 122 and/or traces (not shown). The conductive pattern layer 120 is a layout pattern on the surface of the light-pervious cover layer 110 for electrically connecting to the fingerprint sensing chip 130. The conductive pattern layer 120 inputting the signal to the fingerprint sensing chip 130 and outputting the signal from the fingerprint sensing chip 130 is designed according to the requirements of the electrical connections. For example, the conductive pattern layer 120 can be a redistribution layer (RDL) for re-arranging the layout design of the fingerprint sensing chip 130.

The fingerprint sensing chip 130 is disposed on the conductive pattern layer 120 and comprises a plurality of electric contacts 132. The positions of the electric contacts 132 is corresponding to the positions of the pads of the pads 122 of the conductive pattern layer 120 so that the electric contacts 132 can be electrically connected to the pads 122 of the conductive pattern layer 120.

In this embodiment, in order to increase the integrity of the fingerprint sensor packaging module 100, the fingerprint sensor packaging module 100 comprise selectively a color layer C1. The color layer C1 is disposed on the light-pervious layer 110, and the color layer C1 is between the conductive pattern layer 120 and the light-pervious layer 110. Namely, the conductive pattern layer 120 is disposed on the color layer C1. The color layer C1 is a color paste having at least one color, such as but not limited to red, white, silver or black. Since the light-pervious layer 110 is pervious to light, the color of the color layer C1 under the light-pervious layer 110 can be appeared. Thus, the color layer C1 is used for providing the fingerprint sensor packaging module 100 with color, and the color of the color layer C1 can be adjusted according to practical requirements.

The circuit board 140 is disposed on the light-pervious layer 110. The circuit board 140 has the trace layer. The trace layer can be a layout pattern consisting of multiple conductive wires (not shown) and multiple electric contacts 142. The circuit board 140 can be electrically connected to the conductive pattern layer 120 through the electric contacts 142, and thereby the signal from the fingerprint sensing chip 130 can be transmitted to the circuit board 140 through the pads 122 of the conductive pattern layer 120. It is to be noted that, the circuit board 140 has the hole H1. The fingerprint sensing chip 130 is accommodated in the hole H1, and the hole H1 exposes the fingerprint sensing chip 130. In this embodiment, the thickness of the fingerprint sensing chip 130 is less than the height of the hole H1. However, in other embodiments, the thickness of the fingerprint sensing chip 130 is not intended to limit the scope of the present disclosure.

The package member 150 at least covers the fingerprint sensing chip 130 and the conductive pattern layer 120. In this embodiment, the package member 150 is disposed in the hole H1. Specifically, the package member 150 fills the hole H1 and the space between the fingerprint sensing chip 130 and the pads 122. It is to be noted that, the thickness of the package member 150 can be adjusted according to the process conditions or the product design so that the thickness of the package member 150 can be slightly larger than the height of the hole H1 or bulges out of the hole H1. However, the thickness of package member 150 is not intended to limit the scope of the present disclosure.

In practice, the material of the package member 150 may be an underfill material or other epoxy molding compound (EMC) material is used for package the fingerprint sensing chip 130 to prevent water vapor from entering the inner fingerprint sensor packaging module.

Figure 2:
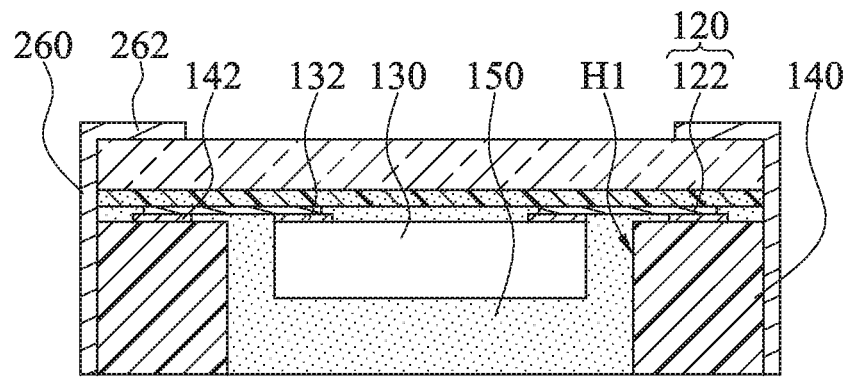
FIG. 2 is a cross-sectional view of a fingerprint sensor packaging module according to the second embodiment of the present disclosure.

FIG. 2 is a cross-sectional view of a fingerprint sensor packaging module according to the second embodiment of the present disclosure. The fingerprint sensor packaging module 200 in accordance with the second embodiment is similar to the fingerprint sensor packaging module 100 in accordance with the first embodiment. The difference between the fingerprint sensor packaging module 200 and 100 is that the fingerprint sensor packaging module 200 comprises an outer conductive ring 260.

The outer conductive ring 260 is an annular ring and surrounds the circuit board 140 and the light-pervious cover layer 110. The outer conductive ring 260 is electrically connected to the fingerprint sensor chip 130 through the circuit board 140. In this embodiment, the outer conductive ring 260 can selectively further comprise an eave 262. The eave 262 extends towards the central of the outer conductive ring 260 and covers a part of the top surface of the light-pervious cover layer 140. However, in another embodiment (not shown), the outer conductive ring 260 can merely surround the circuit board 140 and the light-pervious cover layer 110 without comprising the eave 262.

It is to be noted that, the outer conductive ring 260 is electrically connected to the fingerprint sensing chip 130 through the circuit board 140. The outer conductive ring 260 may be a metallic ring or a ring made of other conductive material. When the user's finger touches the fingerprint sensor packaging module 200, the fingerprint sensing chip 130 emits a signal to the user's finger through the outer conductive ring 260. The signal is changed by the fingerprint and then is reflected back to the fingerprint sensing chip 130 so that the fingerprint sensing chip 130 can identify the user's identity.

Figure 3:
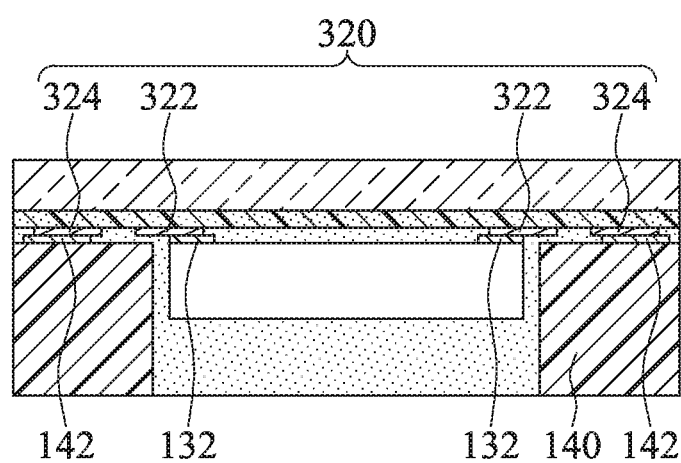
FIG. 3 is a cross-sectional view of a fingerprint sensor packaging module according to the third embodiment of the present disclosure.

FIG. 3 is a cross-sectional view of a fingerprint sensor packaging module according to the third embodiment of the present disclosure. The difference between the fingerprint sensor packaging module 300 in accordance with the third embodiment and the fingerprint sensor packaging module 100 is mainly the conductive pattern layer 320.

In this embodiment, the conductive pattern layer 320 further comprises an inner conductive ring 324. The inner conductive ring 324 is an annular layout pattern surrounding the fingerprint sensing chip 130. The inner conductive ring 324 can be electrically connected to the fingerprint sensing chip 130 through the pads 322 of the conductive pattern layer 320 or other layout pattern (not shown). However, the electric connection between the fingerprint sensing chip 130 and inner conductive ring 324 is not intended to limit the scope of the present invention. In this embodiment, the circuit board 140 is disposed on the inner conductive ring 342 and pads 322 of the conductive pattern layer 320 so that the signal from the fingerprint sensing chip 130 can be transmitted to the circuit board 140 through the inner conductive ring 324 and the pads 322 of the conductive pattern layer 320.

FIGS. 4A-4E are schematic diagrams each illustrating steps of method of manufacturing a fingerprint sensor packaging module according to the first embodiment of the present disclosure.

Figure 4A:
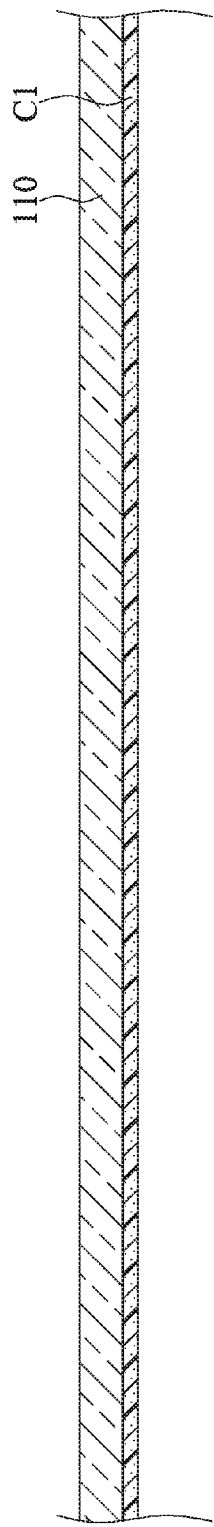
FIGS. 4A-4E are schematic diagrams each illustrating steps of method of manufacturing a fingerprint sensor packaging module according to the first embodiment of the present disclosure.

First, please refer to FIG. 4A, the color layer C1 is formed on the light-pervious cover layer. The term "on" used herein refers to that the color layer C1 is disposed on one of the surfaces of the light-pervious cover layer 110, rather than that the directional descriptions in the physical space, such as "above", "below" and the like. Namely, the color layer C1 can be formed on the top surface or the lower surface of the light-pervious cover layer 110. In this embodiment, the color layer C1 is formed on the lower surface of the light-pervious cover layer 110. The color layer C1 is a color paste having at least one color. Since the light-pervious layer 110 is pervious to light, the color of the color layer C1 under the light-pervious layer 110 can be appeared. Thus, the color layer C1 is used for providing the fingerprint sensor packaging module 100 with color, and the color of the color layer C1 can be adjusted according to practical requirements. The step of forming the color layer C1 on the light-pervious cover layer 110 is selective step. In another embodiment, the fingerprint sensor package module manufactured by the method cannot comprise the color layer C1.

Figure 4B:
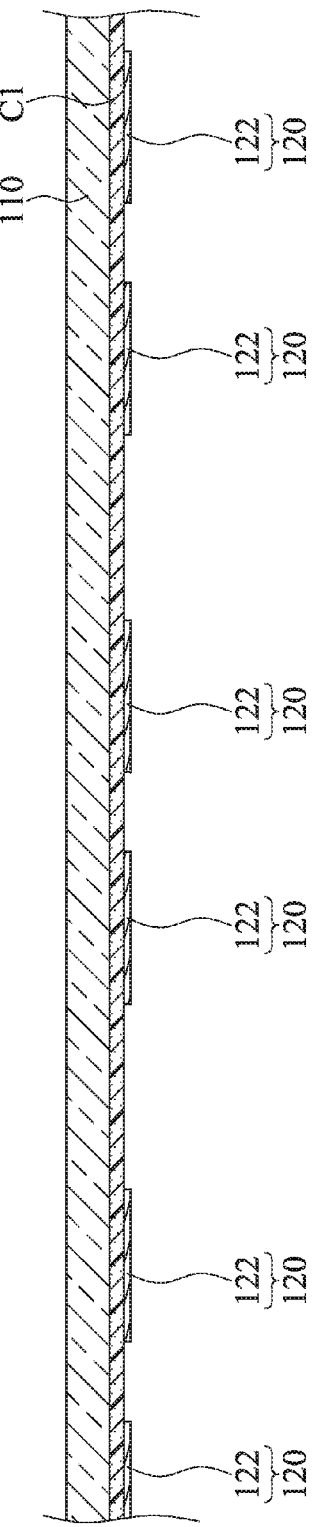

Please refer to FIG. 4B. The conductive pattern layer 120 is formed on the color layer C1. The conductive pattern layer 120 is formed on the surface of the color layer C1, rather than that the directional descriptions in the physical space, such as "above", "below" and the like. In this embodiment, the conductive pattern layer 120 is formed on the color layer C1 and the color layer C1 is between the light-pervious cover layer 110 and the conductive pattern layer 120. However, in another embodiment(not shown), the color layer C1 can be disposed on the top surface of the light-pervious cover layer 110, and the conductive pattern layer 120 is disposed on the lower surface of the light-pervious cover layer 110. Namely, the color layer C1 and the conductive pattern layer 120 are respectively disposed on the opposite surfaces. It is to be noted that, the conductive pattern layer 120 comprising a plurality of pads 122 and/or traces (not shown) is designed according to the requirements of electrically connections. For example, the conductive pattern layer 120 can be a redistribution layer (RDL). In another embodiment, the fingerprint sensor package module manufactured by the method cannot comprise the color layer C1, and the conductive pattern layer 120 is directly formed on the light-pervious cover layer 110.

Figure 4C:
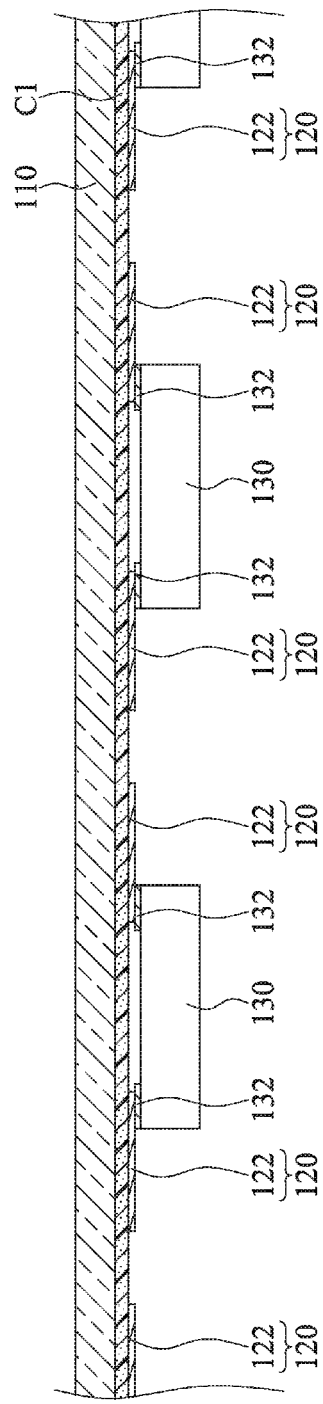

Please refer to FIG. 4C. At least one fingerprint sensing chip 130 is disposed on the conductive pattern layer 120, and the electric contacts 132 of the fingerprint sensing chip 130 contact to the pads 122 of the conductive pattern layer 120 so as to be electrically connected to the conductive pattern layer 120.

Figure 4D:
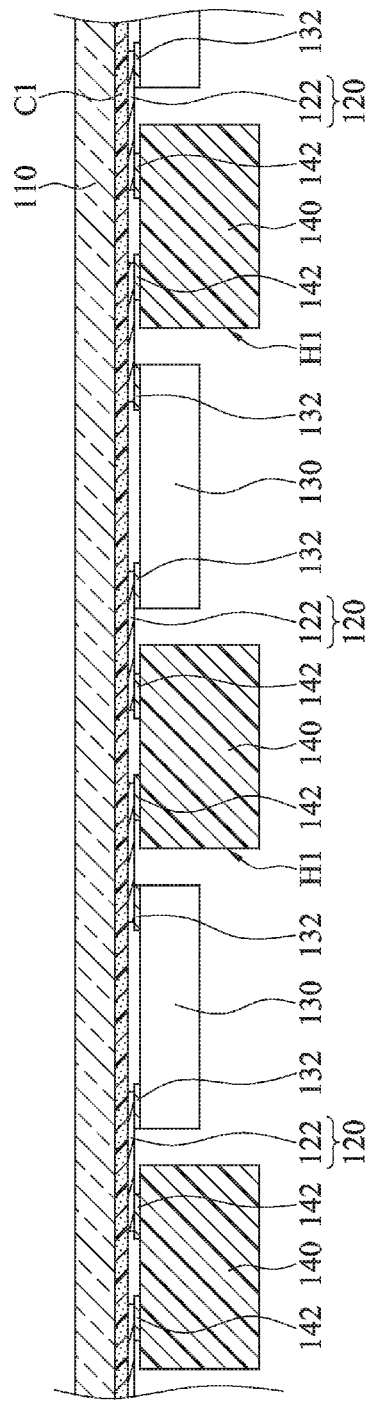

Please refer to FIG. 4D. The circuit board 140 is disposed on the light-pervious cover layer 110, and the circuit board 140 is electrically connected to the conductive pattern layer 120. Specifically, the electric contacts 142 of the circuit board 140 are electrically connected to the pads 122 of the conductive pattern layer 120, and thereby the signal from the fingerprint sensing chip 130 can be transmitted to the circuit board 140 through the pads 122 of the conductive pattern layer 120.

The circuit board 140 have at least one hole H1, and the fingerprint sensing chip 130 is accommodated in the hole H1, and the hole H1 exposes the fingerprint sensing chip 130.

Figure 4E:
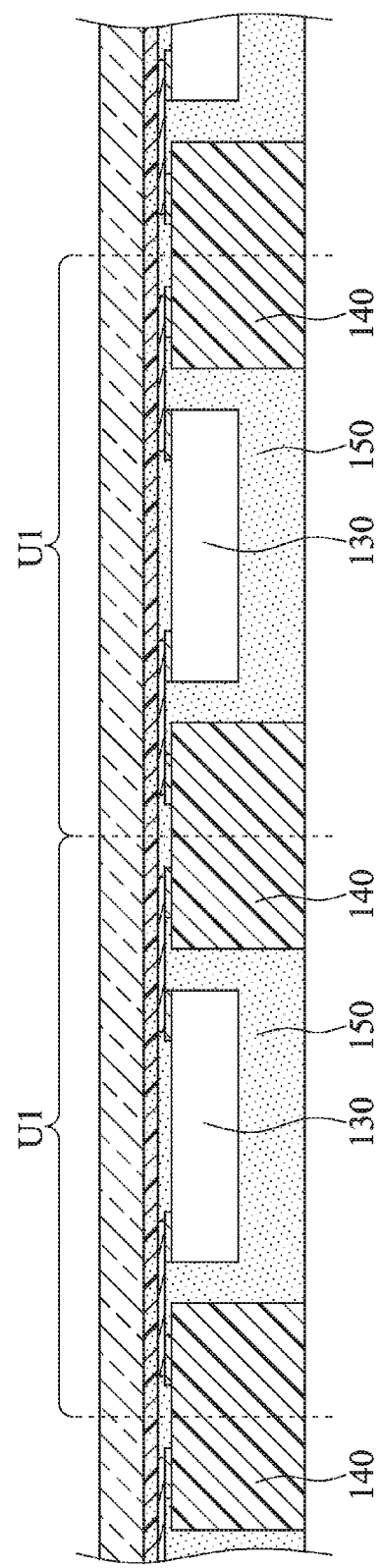

Please refer to FIG. 4E. The package member 150 is disposed in the hole H1. Specifically, the material of the package member 150 may be an underfill material for filling the hole H1 and the space between the fingerprint sensing chip 130 and the pads 122 and covering the fingerprint sensing chip by a dispensing process. Or, the material of the package member 150 may be epoxy molding compound (EMC) for filling the hole H1. Next, in this embodiment, the light-pervious cover layer 110 is severed between adjacent fingerprint sensing chips 130 to form a plurality of packaging units U1. Thus, the packaging unit U1 is essentially the fingerprint sensor packaging module 100. It is to be noted that, for the product design, the fingerprint sensor packaging module cannot comprise the outer conductive ring 260 selectively (shown in FIG. 1B) or the fingerprint sensor packaging module can comprise the outer conductive ring 260 surrounding the packaging units U1 and contacting to the circuit board 140 (shown in FIG. 2). The outer conductive ring 260 is not intended to limit the scope of the present disclosure.

FIGS. 5A-5D are schematic diagrams each illustrating steps of a method of manufacturing a fingerprint sensor packaging module according to the second embodiment of the present disclosure. The method of manufacturing a fingerprint sensor packaging module in accordance with the second embodiment is similar to the method of manufacturing a fingerprint sensor packaging module in accordance with the first embodiment. The following detailed description explains with schemas the difference between the first and the second embodiments. Please refer to FIGS. 5A-5D sequentially.

The step shown in FIG. 5A in accordance with the second embodiment follows the step shown in the FIG. 4A in accordance with the first embodiment. Please refer to FIG. 5A. The conductive pattern layer 320 is formed on the color layer C1. The conductive pattern layer 320 comprises a plurality of pads 322, the inner conductive ring 324 and/or traces (not shown).

Please refer to FIG. 5B. At least one fingerprint sensing chip 130 is disposed on the conductive pattern layer 320, and the electric contacts 132 of the fingerprint sensing chip 130 contact to the pads 322 of the conductive pattern layer 320 so as to be electrically connected to the conductive pattern layer 320. The inner conductive ring 324 surrounds the fingerprint sensing chip 130 and is electrically connected to the fingerprint sensing chip 130 through other layout pattern (not shown).

Please refer to FIG. 5C. The circuit board 140 is disposed on the light-pervious cover layer 110 and electrically connected to the conductive pattern layer 320. Specifically, the electric contacts 142 of the circuit board 140 are electrically connected to the pads 322 of the conductive pattern layer 320 and the inner conductive ring 324 so that the signal from the fingerprint sensing chip 130 can be transmitted to the circuit board 140 through the inner conductive ring 324 and the pads 322 of the conductive pattern layer 320. The circuit board 140 have at least one hole H1. The fingerprint sensing chip 130 is accommodated in the hole H1, and the hole H1 exposes the fingerprint sensing chip 130.

Please refer to the FIG. 5D. The package member 150 is disposed in the hole H1. Specifically, the package member 150 fills the hole H1 and the space between the fingerprint sensing chip 130 and the pads 322 and covers the fingerprint sensing chip by a dispensing process. Next, in this embodiment, the light-pervious cover layer 110 is severed between adjacent inner conductive rings 324 to form a plurality of packaging units U1. Thus, the packaging unit U1 is approximately equal to the fingerprint sensor packaging module 300.

In summary, in the above mentioned embodiment, the fingerprint sensor packaging module of the present disclosure comprises the light-pervious cover layer, the conductive pattern layer, the fingerprint sensing chip, the circuit board, and the packaging member. The fingerprint sensing chip is disposed on the light-pervious cover layer formed with the conductive pattern layer. The circuit board having the hole is disposed on the light-pervious cover layer formed with the conductive pattern layer, and the hole exposes the fingerprint sensing chip. The packaging member is accommodated in the hole for at least covering a part of the fingerprint sensing chip. When the finger or other objects forces on the light-pervious cover layer, the circuit board can afford a part of force, so as to increase the integral strength of e fingerprint sensor packaging module. Beside, the static electricity from the finger or other objects can be leaded out from the fingerprint sensing chip to the circuit board so that the circuit board can provide fingerprint sensor packaging module with the protection from electrostatic discharge.

In addition, the fingerprint sensor packaging module according to one embodiment of the present disclosure comprises the outer conductive ring which surrounds the circuit board and the light-pervious cover layer. The fingerprint sensor packaging module according to another embodiment of the present disclosure comprises the inner conductive ring which surrounds the fingerprint sensing chip, and the inner conductive ring can be electrically connected to the fingerprint sensing chip through the pads of the conductive pattern layer or other layout pattern. Thus, the design flexibility of the fingerprint sensor packaging module can be improved.

The method of manufacturing a fingerprint sensor packaging module according to one embodiment of the present disclosure can manufacture the individual and modularized packaging module that is capable of easily mounting on the electronic devices, such as the smart phone, notebook and the like.

In addition, in the method of manufacturing a fingerprint sensor packaging module according to one embodiment of the present disclosure, the light-pervious cover layer can be used as the light-pervious substrate of the electronic devices such as the screen substrate of the smart phone, notebook and the like. Thus, in the above mentioned method of the present disclosure, the fingerprint sensing chip is capable of directly mounting on the screen substrate of the electronic devices. The signal of the fingerprint sensing chip can be transmitted out through the circuit board, so that the complicated layout circuit for mounting the fingerprint sensing chip on the screen substrate of the electronic devices can be simplified and avoided.

While the instant disclosure has been described by way of example and in terms of the preferred embodiments, it is to be understood that the invention needs not be limited to the disclosed embodiments. For anyone skilled in the art, various modifications and improvements within the spirit of the instant disclosure are covered under the scope of the instant disclosure. The covered scope of the instant disclosure is based on the appended claims.

What is claimed is:

1. A fingerprint sensor packaging module, comprising:
   a light-pervious cover layer;
   a conductive pattern layer on the light-pervious cover layer and comprising a plurality of pads;
   a fingerprint sensing chip disposed on the conductive pattern layer and in contact with the pads to be electrically connected to the conductive pattern layer;
   a circuit board disposed on the light-pervious cover layer and electrically connected to the conductive pattern layer, wherein the circuit board has a hole and the fingerprint sensing chip is disposed in the hole; and
   a package member disposed in the hole and at least covering the fingerprint sensing chip.

2. The fingerprint sensor packaging module of claim 1, wherein the fingerprint sensor packaging module further comprises an outer conductive ring, the outer conductive ring surrounds the circuit board, and the outer conductive ring is electrically connected to the fingerprint sensing chip.

3. The fingerprint sensor packaging module of claim 2, wherein the outer conductive ring comprises an eave, the eave extends towards the central of the outer conductive ring and covers a part of a top surface of the light-pervious cover layer.

4. The fingerprint sensor packaging module of claim 1, wherein the fingerprint sensor packaging module further comprises an inner conductive ring, the inner conductive ring surrounds the fingerprint sensing chip and is electrically connected to the fingerprint sensing chip.

5. The fingerprint sensor packaging module of claim 1, wherein the fingerprint sensor packaging module further comprises a color layer, and the color layer is disposed on the light-pervious cover layer, and the conductive pattern layer is disposed on the color layer.

6. The fingerprint sensor packaging module of claim 1, wherein the conductive pattern layer is a redistribution layer.

7. A method of manufacturing a fingerprint sensor packaging module, comprising:
   forming a conductive pattern layer on a light-pervious cover layer and comprising a plurality of pads;
   disposing at least one fingerprint sensing chip on the conductive pattern layer, wherein the fingerprint sensing chip is electrically connected to the conductive pattern layer by contacting to the pads;
   disposing a circuit board on the light-pervious cover layer, wherein the circuit board is electrically connected to the conductive pattern layer and has a hole, and the fingerprint sensing chip is disposed in the hole; and disposing a package member in the hole, wherein the package member at least covers the fingerprint sensing chip.

8. The method of manufacturing a fingerprint sensor packaging module of claim 7, further comprises:
before forming the conductive pattern layer on a light-pervious cover layer, forming a color layer on the light-pervious cover layer, wherein the conductive pattern layer is disposed on the color layer.

9. The method of manufacturing a fingerprint sensor packaging module of claim 7, further comprising:
severing the light-pervious cover layer between adjacent fingerprint sensing chips to form a plurality of packaging units.

10. The method of manufacturing a fingerprint sensor packaging module of claim 7, further comprising:
disposing an outer conductive ring on the packaging unit, wherein the outer conductive ring surrounds the packaging unit and is electrically connected to the circuit board.

11. The method of manufacturing a fingerprint sensor packaging module of claim 7, wherein the conductive pattern layer further comprises at least one inner conductive ring, and the inner conductive ring surrounds the fingerprint sensing chip and is electrically connected to the fingerprint sensing chip.

12. The method of manufacturing a fingerprint sensor packaging module of claim 7, wherein the conductive pattern layer is a redistribution layer.

* * * * *